(12) United States Patent
Choi et al.

(10) Patent No.: US 7,329,580 B2
(45) Date of Patent: Feb. 12, 2008

(54) METHOD OF FABRICATING A SEMICONDUCTOR DEVICE HAVING SELF-ALIGNED FLOATING GATE AND RELATED DEVICE

(75) Inventors: Byung-Yong Choi, Gyeonggi-do (KR); Choong-Ho Lee, Gyeonggi-do (KR); Tae-Yong Kim, Gyeonggi-do (KR); Dong-Gun Park, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/425,205

(22) Filed: Jun. 20, 2006

(65) Prior Publication Data

US 2007/0090443 A1    Apr. 26, 2007

(30) Foreign Application Priority Data

Oct. 26, 2005    (KR) .................. 10-2005-0101509

(51) Int. Cl.
*H01L 21/336*    (2006.01)
(52) U.S. Cl. ............... 438/257; 438/259; 438/266
(58) Field of Classification Search ............ 438/197, 438/201, 206, 209, 211, 212, 257, 259, 266, 438/270
See application file for complete search history.

(56) References Cited

U.S. PATENT DOCUMENTS 6,605,514 B1    8/2003    Tabery et al.
6,635,923 B2    10/2003   Hanafi et al.
6,657,252 B2    12/2003   Fried et al.
6,864,164 B1    3/2005    Murthy et al.
2004/0099900 A1   5/2004  Iguchi et al.
2004/0262687 A1*  12/2004 Jung et al. .................. 257/347
2005/0104096 A1*  5/2005  Lee et al. .................... 257/288

* cited by examiner

Primary Examiner—Tuan H. Nguyen
(74) Attorney, Agent, or Firm—Marger Johnson & McCollom, P.C.

(57) ABSTRACT

A semiconductor device such as a flash memory device having a self-aligned floating gate and a method of fabricating the same is provided. An embodiment of the device includes an isolation layer defining a fin body is formed in a semiconductor substrate. The fin body has a portion protruding above the isolation layer. A sacrificial pattern is formed on the isolation layer. The sacrificial pattern has an opening self-aligned with the protruding portion of the fin body. The protruding fin body is exposed in the opening. An insulated floating gate pattern is formed to fill the opening. The sacrificial pattern is then removed. An inter-gate dielectric layer covering the floating gate pattern is formed. A control gate conductive layer is formed over the inter-gate dielectric layer. The control gate conductive layer, the inter-gate dielectric layer, and the floating gate pattern are patterned to form a control gate electrode crossing the fin body as well as the insulated floating gate interposed between the control gate electrode and the fin body.

23 Claims, 11 Drawing Sheets

METHOD OF FABRICATING A SEMICONDUCTOR DEVICE HAVING SELF-ALIGNED FLOATING GATE AND RELATED DEVICE

CROSS-REFERENCE TO RELATED APPLICATION

This application claims priority to and the benefit of Korean Patent Application No. 2005-0101509, filed Oct. 26, 2005, which is incorporated herein by reference in its entirety.

BACKGROUND

1. Field of the Invention

The present invention relates to a semiconductor device such as a nonvolatile memory device and a method of fabricating the same, and more particularly, to a flash memory device having a self-aligned floating gate and a method of fabricating the same.

2. Description of the Related Art

In general, semiconductor memory devices storing data can be classified into volatile memory devices and nonvolatile memory devices. Volatile memory devices lose data stored in them when power is cut off, while nonvolatile memory devices retain stored data even when the power is cut off. Accordingly, nonvolatile memory devices, such as flash memory devices, are widely used in mobile storage devices, mobile telecommunication systems, and other devices that may experience power loss.

Meanwhile, as the size and power consumption of electronic systems are gradually reduced, the required integration density of flash memory devices increases. Consequently, gates constituting a unit cell of a flash memory device should also be scaled down. One technique proposed in recent years to scale down the gates includes forming floating and control gates on an active region of a fin structure to fabricate the flash memory cell.

A typical technique in forming a floating gate employs a conventional patterning process. The patterning process requires a process margin to prepare for potential alignment errors in a photolithography process. In other words, there are many limitations in fabricating the scaled-down floating gate. In order to cope with alignment error, a technique of foaming the floating gate using self-align technology has been researched.

A nonvolatile memory device having the fin structure and a method of fabricating the same are disclosed in U.S. Pat. No. 6,657,252 B2 entitled "FinFET CMOS with NVRAM capability" to Fried et al. According to Fried et al., an insulated floating gate is disposed on the sidewalls of a fin body, and an insulated control gate is disposed to cover the floating gate. Further, Fried et al. provides an example where the floating gate can be formed self-aligned with the fin body. The floating gate is formed by forming a polysilicon layer covering the fin body and then anisotropically etching the polysilicon layer. In this case, the thickness of the floating gate can depend on the height of the fin body and the deposition thickness of the polysilicon layer. However, there is a limitation in adjusting the thickness of the floating gate.

Another method of fabricating a nonvolatile memory device is disclosed in US Patent Publication No. 2004-0099900 entitled "Semiconductor Device and Method of Manufacturing the same" to Iguchi et al.

Nevertheless, techniques of forming a flash memory device having a self-aligned floating gate require continuous improvement.

SUMMARY

Embodiments of the invention provide a memory device having a self-aligned floating gate and a method of fabricating the same.

In one embodiment, the invention is directed to a method of fabricating a flash memory device having a self-aligned floating gate. The method includes forming an isolation layer to define a fin body in a semiconductor substrate. The fin body is formed to have a first sidewall, a second sidewall facing the first sidewall, and a top surface. The fin body also has a portion protruding above the isolation layer. The isolation layer has a sacrificial pattern formed thereon. The sacrificial pattern has an opening self-aligned with the protruding portion of the fin body. The protruding fin body is exposed in the opening. An insulated floating gate pattern is formed to fill the opening. The sacrificial pattern is then removed. An inter-gate dielectric layer covering the floating gate pattern is formed. A control gate conductive layer is formed over the inter-gate dielectric layer. The control gate conductive layer, the inter-gate dielectric layer, and the floating gate pattern are patterned to form a control gate electrode crossing the fin body as well as a floating gate interposed between the control gate electrode and the fin body.

BRIEF DESCRIPTION OF THE DRAWINGS

The foregoing and other objects, features and advantages of the invention will be apparent from the detailed description of exemplary embodiments of the invention, as illustrated in the accompanying drawing. The drawing is not necessarily to scale, emphasis instead being placed upon illustrating the principles of the invention.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. In addition, when a layer is described as being formed "on" another layer or substrate that layer may be formed directly on the other layer or substrate, or a third layer may be interposed between the layer and the other layer or substrate. Like numbers refer to like elements throughout the specification.

Figure 1:
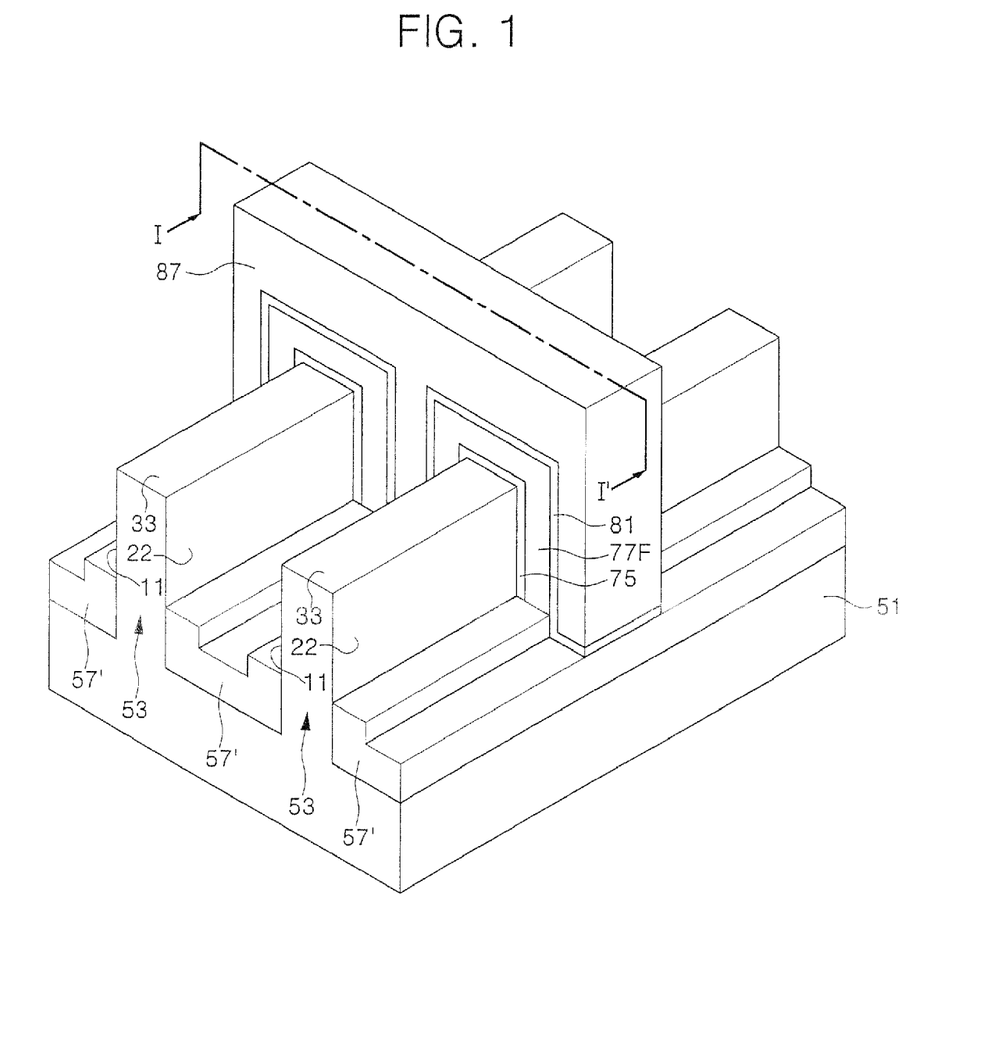
FIG. 1 is a perspective view showing a part of a flash memory device according to a first embodiment of the present invention.

FIG. 1 is a perspective view showing a part of a nonvolatile memory device such as a flash memory device according to a first embodiment of the present invention. FIGS. 2 to 11 are cross-sectional views taken along line I-I' of FIG. 1, illustrating a method of fabricating a memory device according to the first embodiment of the present invention. Further, FIG. 12 is a; perspective view showing a part of a memory device according to a second embodiment of the present invention, and FIGS. 13 to 19 are cross-sectional views taken along line II-II' of FIG. 12, illustrating a method of fabricating a memory device according to the second embodiment of the present invention.

A method of fabricating a memory device according to a first embodiment of the present invention will now be described with reference to FIGS. 1 to 11.

Figure 2:
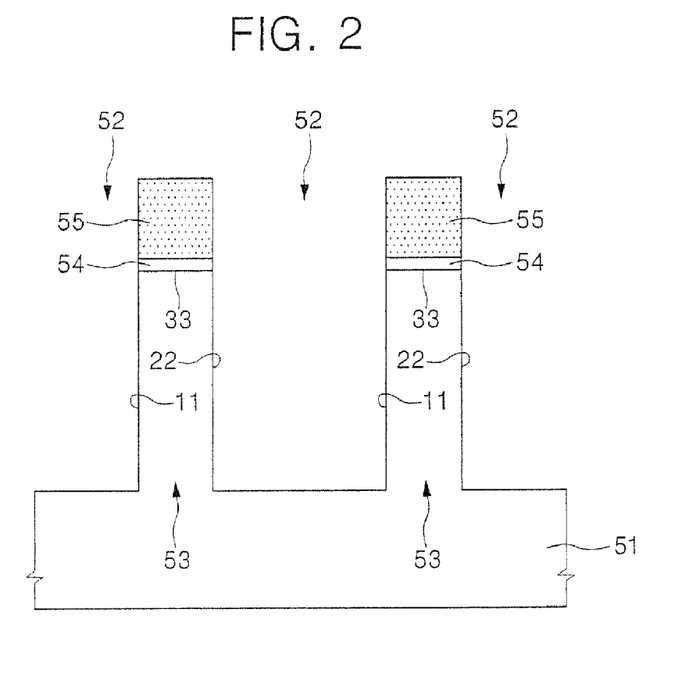
FIGS. 2 to 11 are cross-sectional views taken along line I-I' of FIG. 1, illustrating a method of fabricating a flash memory device according to the first embodiment of the present invention.

Referring to FIGS. 1 and 2, a trench 52 defining a fin body 53 is formed in a predetermined region of a semiconductor substrate 51.

Specifically, a mask layer may be formed on the semiconductor substrate 51. The mask layer may be patterned to expose the predetermined region of the semiconductor substrate 51; thus forming a hard mask pattern 55. The semiconductor substrate 51 may be a silicon wafer. The hard mask pattern 55 may comprise a nitride layer, such as a silicon nitride layer, by a chemical vapor deposition (CVD) method.

Before the mask layer is formed, a pad oxide layer 54 may be formed on the semiconductor substrate 51. The pad oxide layer 54 may comprise a thermal oxide layer. The pad oxide layer 54 may release physical stress due to a difference in thermal expansion coefficient between the semiconductor substrate 51 and the mask layer. The pad oxide layer 54 may be patterned together with the hard mask pattern 55 and thus remain under the hard mask pattern 55. Alternatively, the pad oxide layer 54 may be omitted.

The semiconductor substrate 51 is then anisotropically etched using the hard mask pattern 55 as an etch mask thus forming the trench 52 defining the fin body 53. The fin body 53 may have a first sidewall 11, a second sidewall 22 opposite the first sidewall 11, and a top surface 33.

Figure 3:
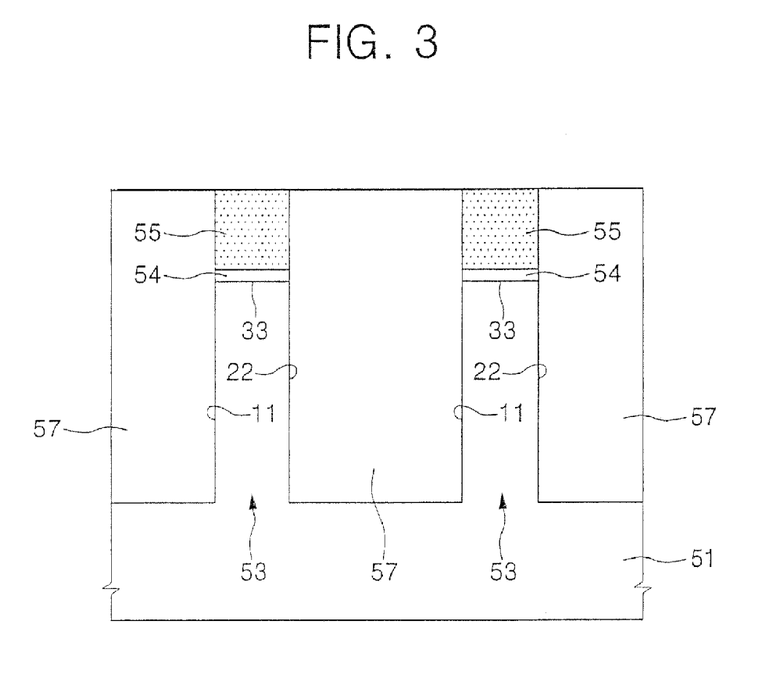

Referring to FIGS. 1 and 3, an insulating layer such as a silicon oxide layer is formed on the semiconductor substrate 51 having the trench 52, and then planarized until the hard mask pattern 55 is exposed. As a result, a preliminary isolation layer 57 may be formed in the trench 52. The planarization may be performed by a chemical mechanical polishing (CMP) process or an etch-back process, for example.

Figure 4:
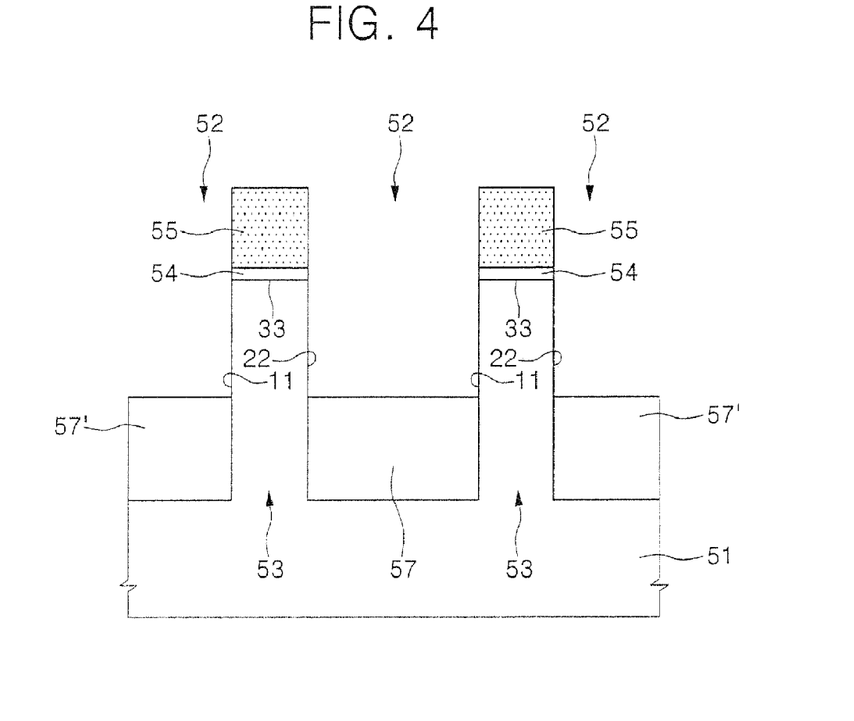

Referring to FIGS. 1 and 4, the preliminary isolation layer 57 is partially removed to form an isolation layer 57'.

The process of partially removing the preliminary isolation layer 57 may be performed by an oxide layer etching process. The preliminary isolation layer 57 may have an etch selectivity with respect to the hard mask pattern 55 and the semiconductor substrate 51. In other words, the preliminary isolation layer 57 may be selectively removed by the oxide layer etching process. As a result, the preliminary isolation layer 57 is recessed with respect to the top surface 33 of the fin body 53 to form the isolation layer 57'. The isolation layer 57' may be formed to fill a lower region of the trench 52. In other words, a portion of the fin body 53 may protrude above the isolation layer 57'. The protruding portion of the fin body 53 may expose a portion of the first and second sidewalls 11 and 22.

Figure 5:
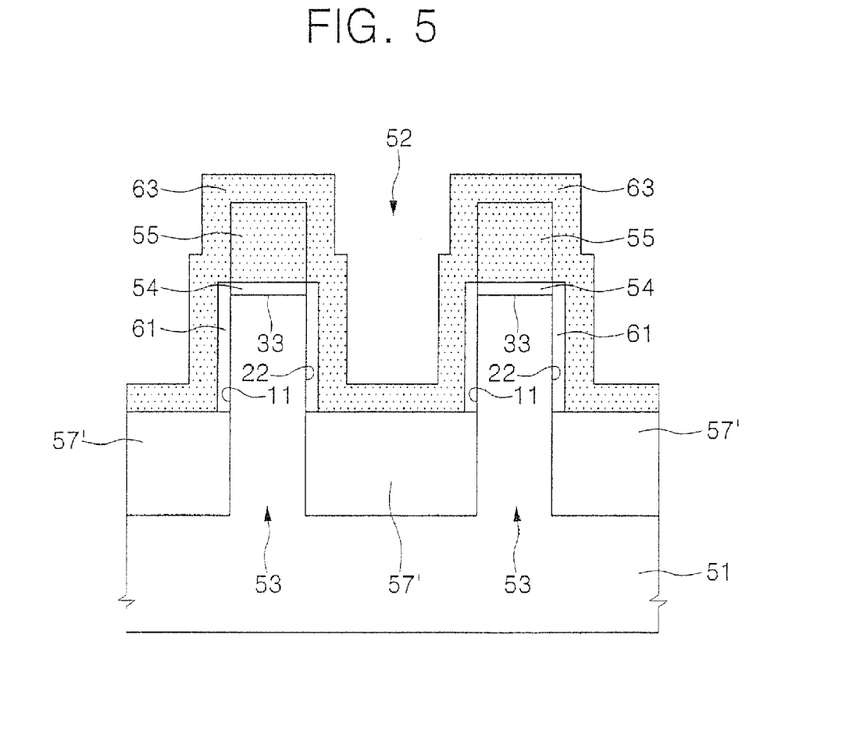

Referring to FIGS. 1 and 5, sacrificial insulating layers such as sacrificial oxide layers 61 may be formed on the exposed first and second sidewalls 11 and 22 of the fin body 53.

The sacrificial oxide layers 61 may comprise a silicon oxide layer by thermal oxidation or CVD. When the sacrificial oxide layers 61 are formed by thermal oxidation, the sacrificial oxide layers 61 may be formed to cover the exposed first and second sidewalls 11 and 22. When the sacrificial oxide layers 61 are formed by CVD, the sacrificial oxide layers 61 may be formed to cover substantially the entire surface of the semiconductor substrate 51.

A sacrificial spacer layer 63 may be formed on the semiconductor substrate 51 having the sacrificial oxide layers 61. The sacrificial spacer layer 63 is preferably formed of the same material layer as the hard mask pattern 55. For example, the sacrificial spacer layer 63 and the hard mask pattern 55 may comprise a nitride layer such as a silicon nitride layer, by CVD. Further, the sacrificial spacer layer 63 may be formed to uniformly cover the protruding first and second sidewalls 11 and 22 of the fin body 53.

Figure 6:
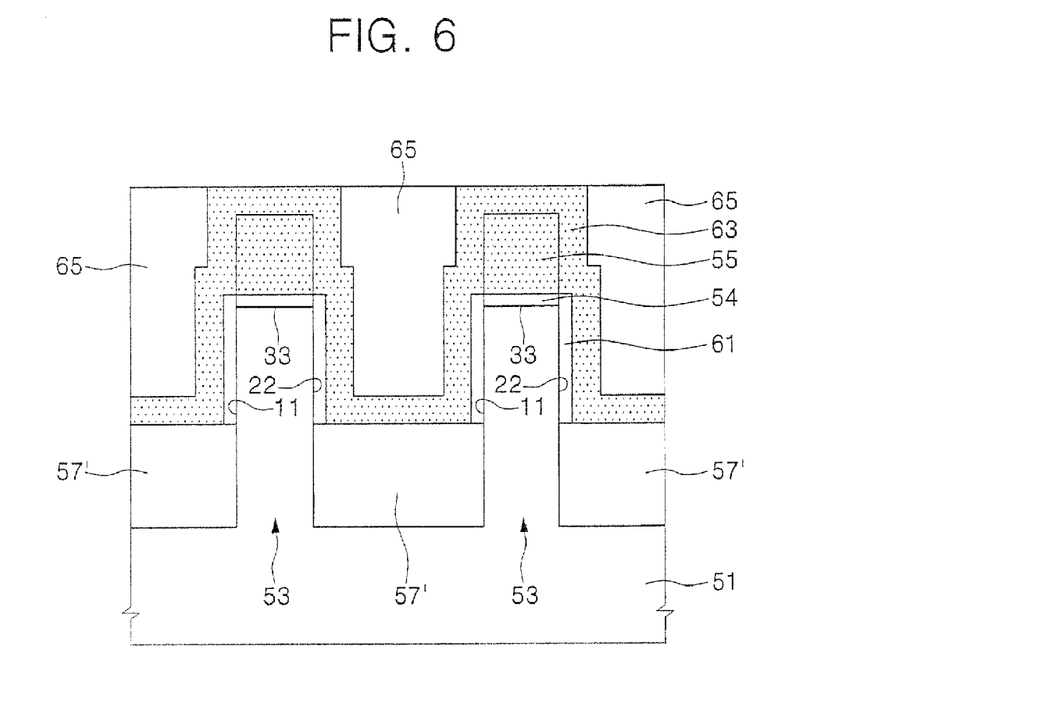

Referring to FIGS. 1 and 6, a sacrificial layer is formed on the semiconductor substrate 51 having the sacrificial spacer layer 63. The sacrificial layer may be formed to fill the trench 52 and cover the semiconductor substrate 51. The sacrificial layer may comprise a material layer having an etch selectivity with respect to the sacrificial spacer layer 63 and the hard mask pattern 55. For example, the sacrificial layer may comprise a silicon oxide layer.

The sacrificial layer may be planarized until a top surface of the sacrificial spacer layer 63 is exposed, thereby forming a sacrificial pattern 65. The planarization is carried out by a CMP process using the sacrificial spacer layer 63 as a CMP stop layer. Alternatively, the planarization may be carried out by an etch-back process. As a result, top surfaces of the sacrificial pattern 65 and the sacrificial spacer layer 63 may be exposed on substantially the same plane. Further, the top surface of the sacrificial pattern 65 may be formed higher than the hard mask pattern 55.

Figure 7:
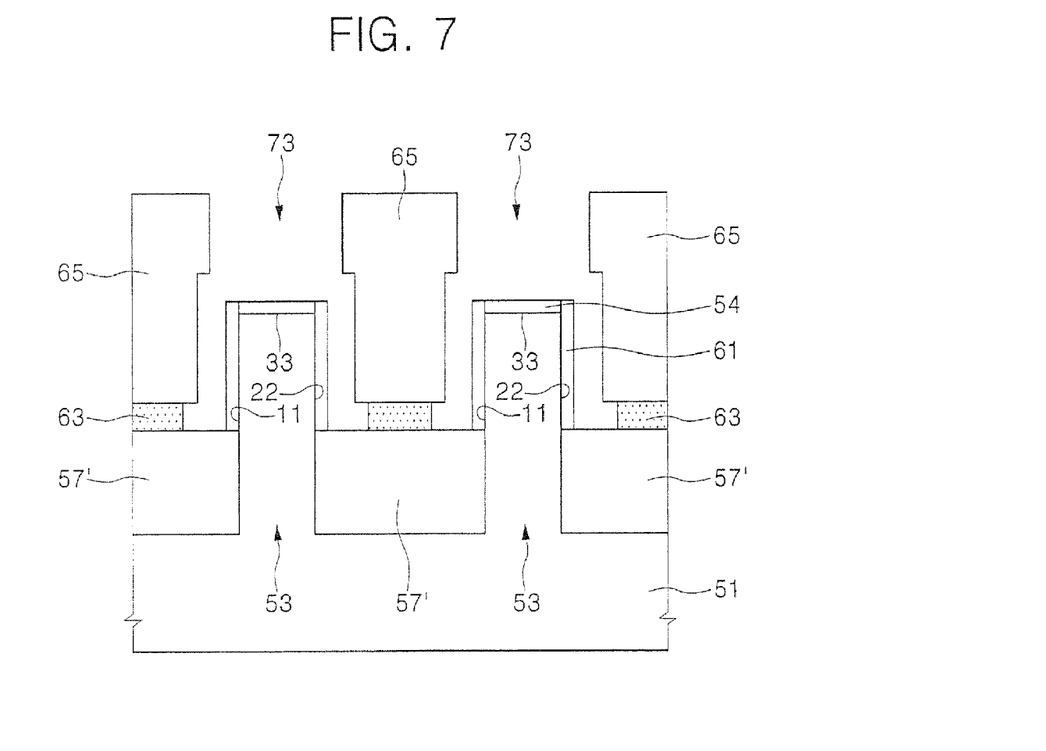

Referring to FIGS. 1 and 7, the sacrificial spacer layer 63 and the hard mask pattern 55 are selectively removed to form a preliminary opening 73.

The process of selectively removing the sacrificial spacer layer 63 and the hard mask pattern 55 may be performed by a nitride layer etching process. The nitride layer etching process has a high etch selectivity between a nitride layer and an oxide layer. That is, the nitride layer etching process shows a high etch rate with respect to the sacrificial spacer layer 63 and the hard mask pattern 55. The process of removing the sacrificial spacer layer 63 and the hard mask pattern 55 may be performed until the isolation layer 57' is exposed from the bottom of the preliminary opening 73. In this case, the sacrificial oxide layers 61, the pad oxide layer 54, and the isolation layer 57' may be exposed in the preliminary opening 73. Further, the sacrificial spacer layer 63 may be partially left between the sacrificial pattern 65 and the isolation layer 57'.

As describe above, the preliminary opening 73 is formed by removing the sacrificial spacer layer 63 and the hard mask pattern 55 without a photolithography process. Thus, the preliminary opening 73 may be formed self-aligned with the protruding fin body 53.

Figure 8:
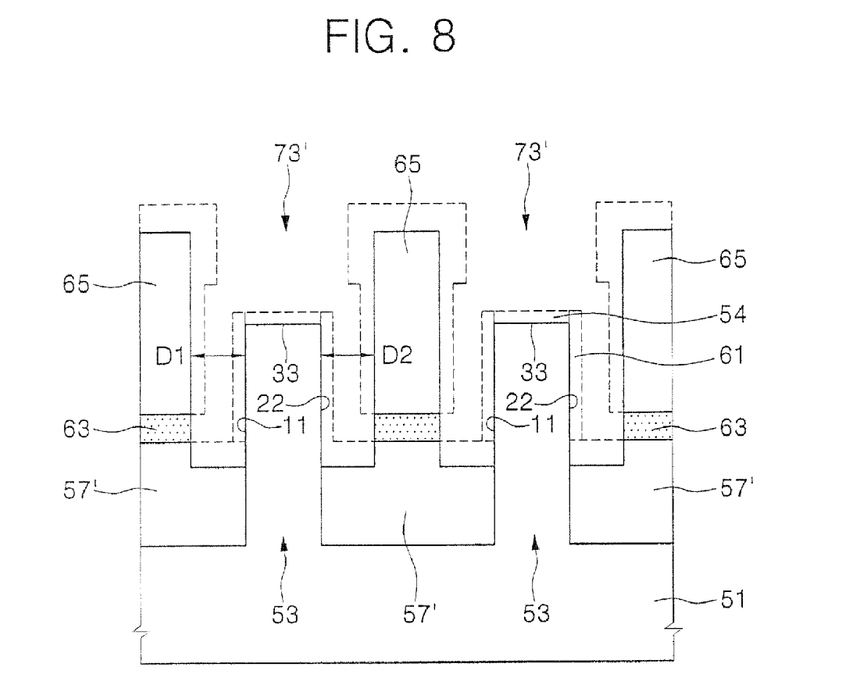

Referring to FIGS. 1 and 8, the preliminary opening 73 may be expanded to form an opening 73'. The expanded opening 73' may be formed to separate the first sidewall 11 from the sacrificial pattern 65 by a first distance D1, and separate the second sidewall 22 from the sacrificial pattern 65 by a second distance D2.

The process of expanding the preliminary opening 73 may be performed by an oxide layer etching process until the protruding fin body 53 is exposed. In this case, the top surface 33, the first sidewall 11, and the second sidewall 22 of the protruding fin body 53 may be exposed in the opening 73'. The sacrificial pattern 65 and the isolation layer 57' may also be partially etched. The top surface of the sacrificial pattern 65 may be formed higher than the protruding fin body 53. Here, the opening 73' may also be formed self-aligned with the protruding fin body 53.

The oxide layer etching process shows substantially the same etch rate with respect to the same material layer. Specifically, the portion of the sacrificial pattern 65 facing the first sidewall 11 and the portion of the sacrificial pattern 65 facing the second sidewall 22 may be etched at substantially the same etch rate. Thus, the first and second distances D1 and D2 may be substantially equal to each other. In addition, when the oxide layer etching process is performed throughout the semiconductor substrate 51 at the same time, the first and second distances D1 and D2 may be substantially equal throughout the semiconductor substrate 51. Consequently, it is possible to control the openings 73' formed on the semiconductor substrate 51 to have substantially the same size.

Figure 9:
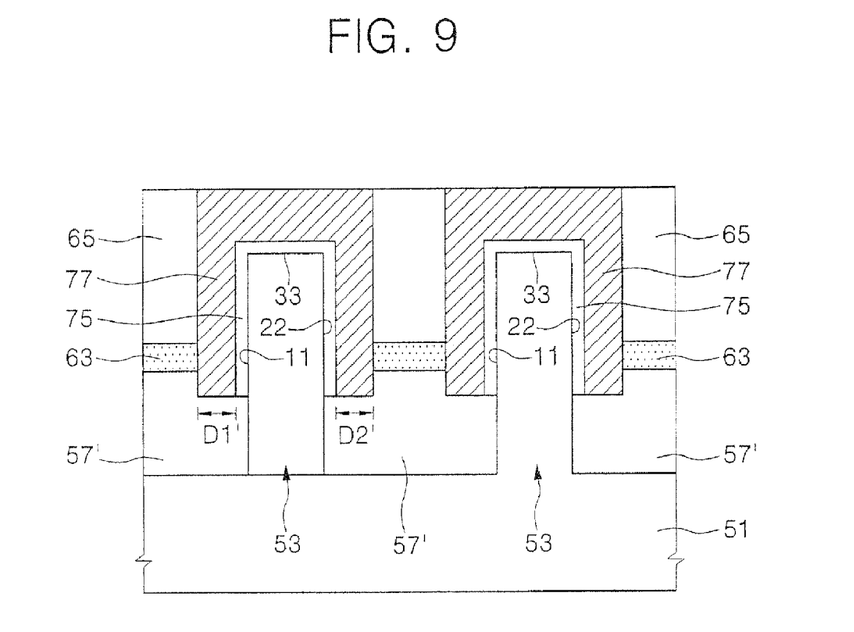

Referring to FIGS. 1 and 9, a tunnel dielectric layer 75 may be formed on the exposed fin body 53. The tunnel dielectric layer 75 may comprise a silicon oxide layer or a high-k dielectric layer such as an $HfO_2$ or $ZrO_2$ layer.

Subsequently, a floating gate layer may be formed to fill the opening 73' and cover the semiconductor substrate 51. The floating gate layer may be planarized to form a floating gate pattern 77 in the opening 73'. The floating gate layer may comprise a polysilicon layer. The process of planarizing the floating gate layer may be performed by a CMP process using the sacrificial pattern 65 as a stop layer. Alternatively, the process of planarizing the floating gate layer may be performed by an etch-back process. The floating gate pattern 77 may be formed to have a generally flat top surface.

The shape of the floating gate pattern 77 may depend on the size and shape of the opening 73'. The floating gate pattern 77 may be formed to a first thickness D1' on the first sidewall 11, and a second thickness D2' on the second sidewall 22. The first and second thicknesses D1' and D2' may be determined by the first and second distances D1 and D2, respectively. In other words, the first and second thicknesses D1' and D2' may be substantially equal to each other. Further, the first and second thicknesses D1' and D2' may be substantially equal to each other throughout the semiconductor substrate 51.

Figure 10:
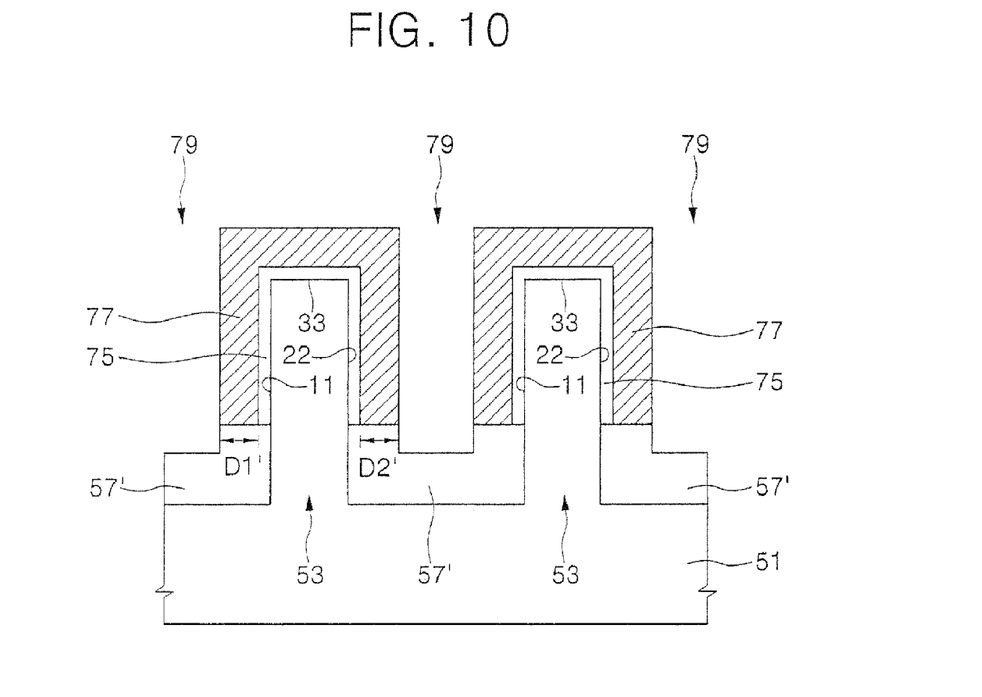

Referring to FIGS. 1 and 10, the sacrificial pattern 65 and the sacrificial spacer layer 63 are removed to expose sidewalls and a top surface of the floating gate pattern 77. The process of removing the sacrificial pattern 65 may be performed by an oxide layer etching process having an etch selectivity with respect to the floating gate pattern 77. The process of removing the sacrificial spacer layer 63 may be performed by a nitride layer etching process. As a result, the sidewalls and top surface of the floating gate pattern 77 may be exposed.

As a result, grooves 79 may be formed between the floating gate patterns 77. The isolation layer 57' may be exposed at the bottom of each groove 79. The isolation layer 57' may also be etched such that the bottom of the groove 79 is located lower than the floating gate pattern 77.

Figure 11:
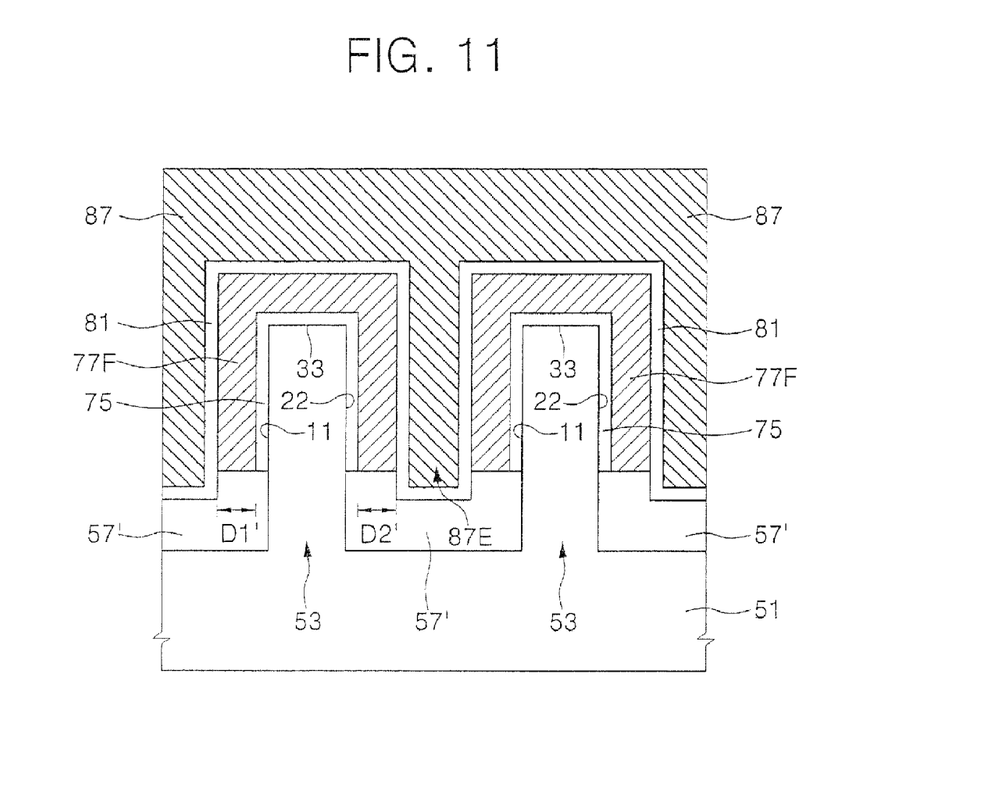
Figure 12:
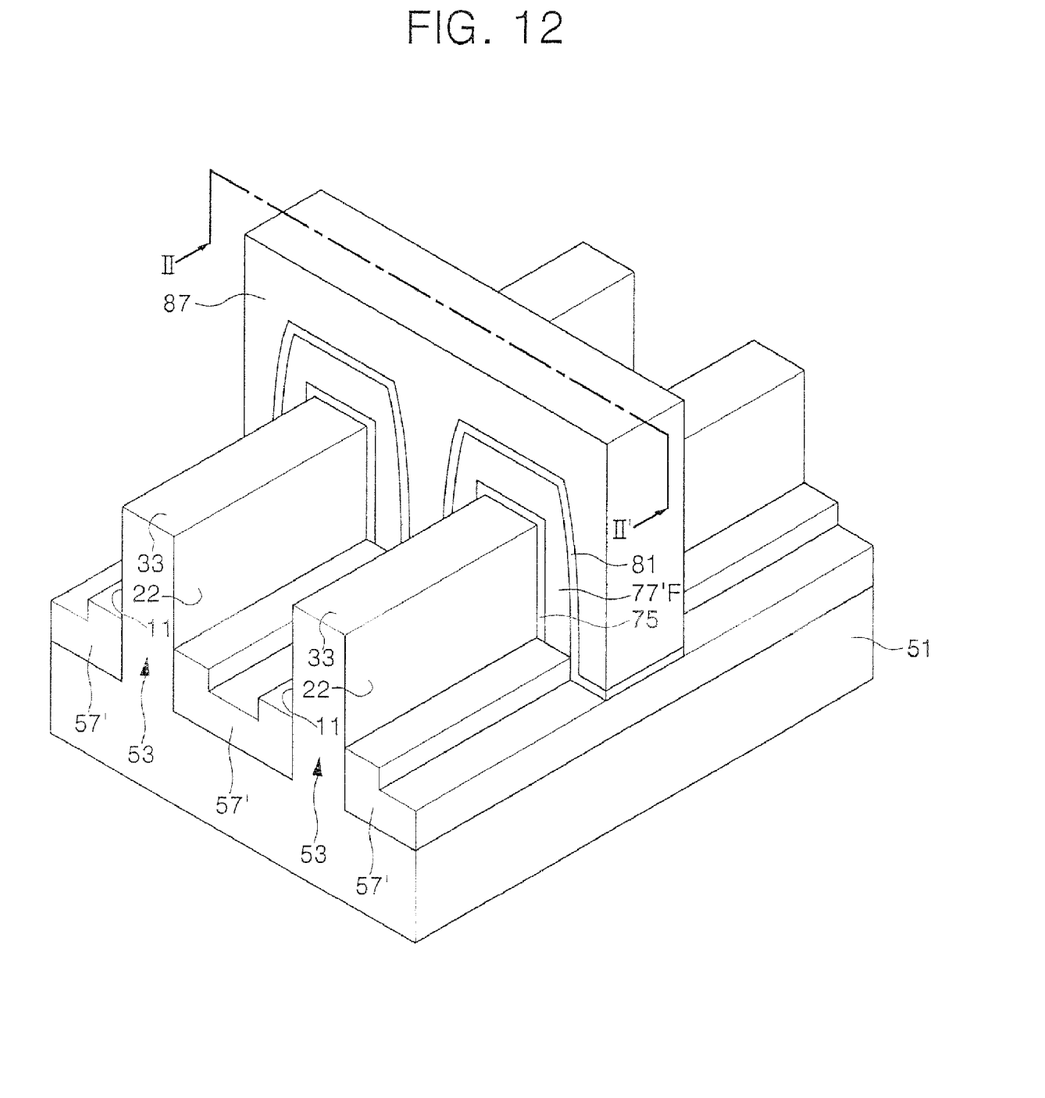
FIG. 12 is a perspective view showing a part of a flash memory device according to a second embodiment of the present invention.

Referring to FIGS. 1 and 11, an inter-gate dielectric layer 81 covering the floating gate pattern 77 is formed on the resulting structure.

The inter-gate dielectric layer 81 may be formed to surround the floating gate pattern 77 at a substantially uniform thickness and to cover the semiconductor substrate 51. The inter-gate dielectric layer 81 may comprise a silicon oxide layer, a silicon nitride layer, a silicon oxynitride layer, a high-k dielectric layer, or a combination layer thereof. For example, the inter-gate dielectric layer 81 may comprise an ONO (Oxide-Nitride-Oxide) layer.

A control gate conductive layer may be formed on substantially the entire surface of the semiconductor substrate 51 having the inter-gate dielectric layer 81. The control gate conductive layer may comprise a polysilicon layer. The control gate conductive layer, the inter-gate dielectric layer 81, and the floating gate pattern 77 are continuously patterned to form a control gate electrode 87 crossing the fin body 53. Further, a floating gate 77F is formed between the control gate electrode 87 and the fin body 53.

While the control gate conductive layer is formed, a control gate extension 87E may be formed in the groove 79. The control gate extension 87E may be formed to contact the control gate electrode 87. Here, the size of the control gate extension 87E may depend on the depth of the groove 79. When the bottom of the groove 79 is formed lower than the floating gate patterns 77, a lower end of the control gate extension 87E may also be formed lower than the floating gate 77F. In other words, the lower end of the control gate extension 87E may be formed to penetrate into the isolation layer 57=. In this case, the control gate extension 87E may prevent parasite capacitance from being generated between the floating gates 77F.

Now, a method of fabricating a flash memory device according to a second embodiment of the present invention will be described with reference to FIGS. 12 to 19.

Figure 13:
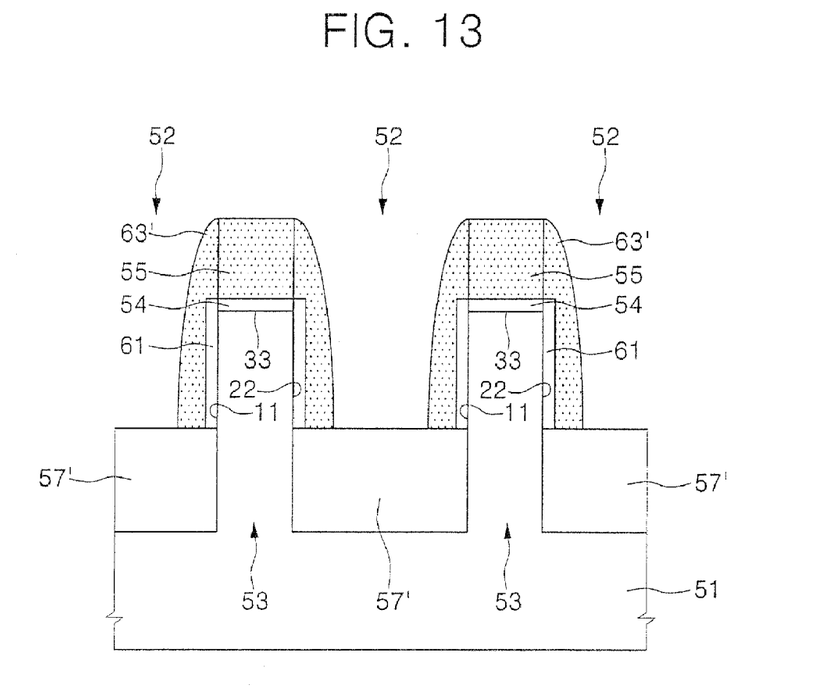
FIGS. 13 to 19 are cross-sectional views taken along line II-II' of FIG. 12, illustrating a method of fabricating a flash memory device according to the second embodiment of the present invention.

Referring to FIGS. 12 and 13, a fin body 53, a pad oxide layer 54, a hard mask pattern 55, an isolation layer 57', a sacrificial oxide layer 61, and a sacrificial spacer layer 63 are formed on a semiconductor substrate 51, as in the method of fabricating the flash memory device according to the first embodiment of the present invention.

The sacrificial spacer layer 63 may be anisotropically etched to form a sacrificial spacer 63' that covers sidewalls of the hard mask pattern 55 and first and second sidewalls 11 and 22 of the fin body 53. The process of anisotropically etching the sacrificial spacer layer 63 may be performed until the isolation layer 57' is exposed in the trench 52. In this case, a top surface of the hard mask pattern 55 may also be exposed.

Figure 14:
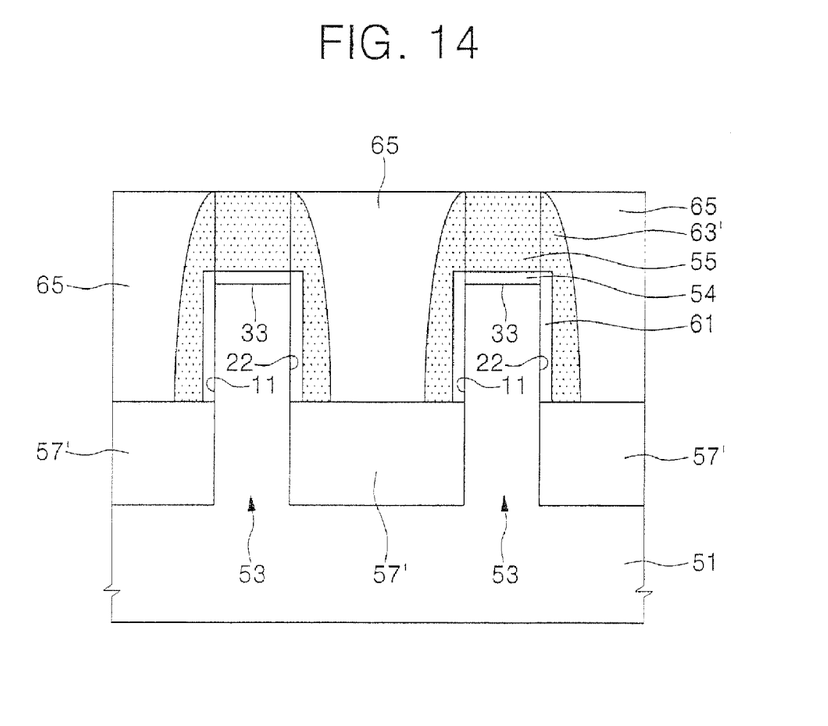

Referring to FIGS. 12 and 14, a sacrificial layer may be formed on the semiconductor substrate 51 having the sacrificial spacer 63' in the same or similar manner as described with reference to FIG. 6. The sacrificial layer may be formed to fill the trench 52 and cover the semiconductor substrate 51. The sacrificial layer may comprise a material layer having an etch selectivity with respect to the sacrificial spacer 63' and the hard mask pattern 55. For example, the sacrificial layer may comprise a silicon oxide layer.

The sacrificial layer may be planarized until the hard mask pattern 55 is exposed, thereby forming a sacrificial pattern 65. At this time, the sacrificial spacer 63' may also be exposed between the sacrificial pattern 65 and the hard mask pattern 55. The planarization may be carried out by a CMP process using the hard mask pattern 55 as a stop layer. Alternatively, the planarization may be carried out by an etch-back process. As a result, top surfaces of the sacrificial pattern 65 and the hard mask pattern 55 may be exposed on substantially the same plane. Further, the top surface of the sacrificial pattern 65 may be formed higher than the fin body 53.

Figure 15:
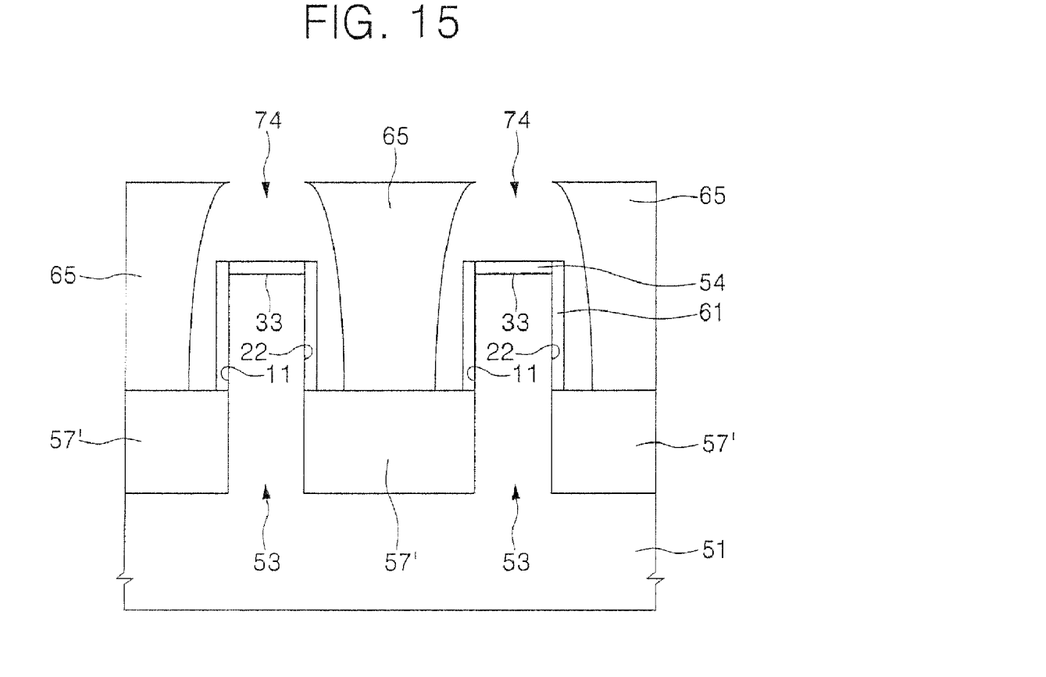

Referring to FIGS. 12 and 15, the sacrificial spacer 63' and the hard mask pattern 55 are selectively removed to form a preliminary opening 74.

The process of selectively removing the sacrificial spacer 63' and the hard mask pattern 55 may be performed by a nitride layer etching process. Here, while the nitride layer etching process is performed, the sacrificial oxide layer 61, the pad oxide layer 54, and the isolation layer 57' are not removed in part because of their low etch selectivity. That is, the nitride layer etching process has a sufficient process margin to remove the sacrificial spacer 63' and the hard mask pattern 55. As a result, the sacrificial oxide layer 61, the pad oxide layer 54, and the isolation layer 57' may be exposed in the preliminary opening 74. Further, the preliminary opening 74 may be formed in the same shape as both the sacrificial spacer 63' and the hard mask pattern 55.

Figure 16:
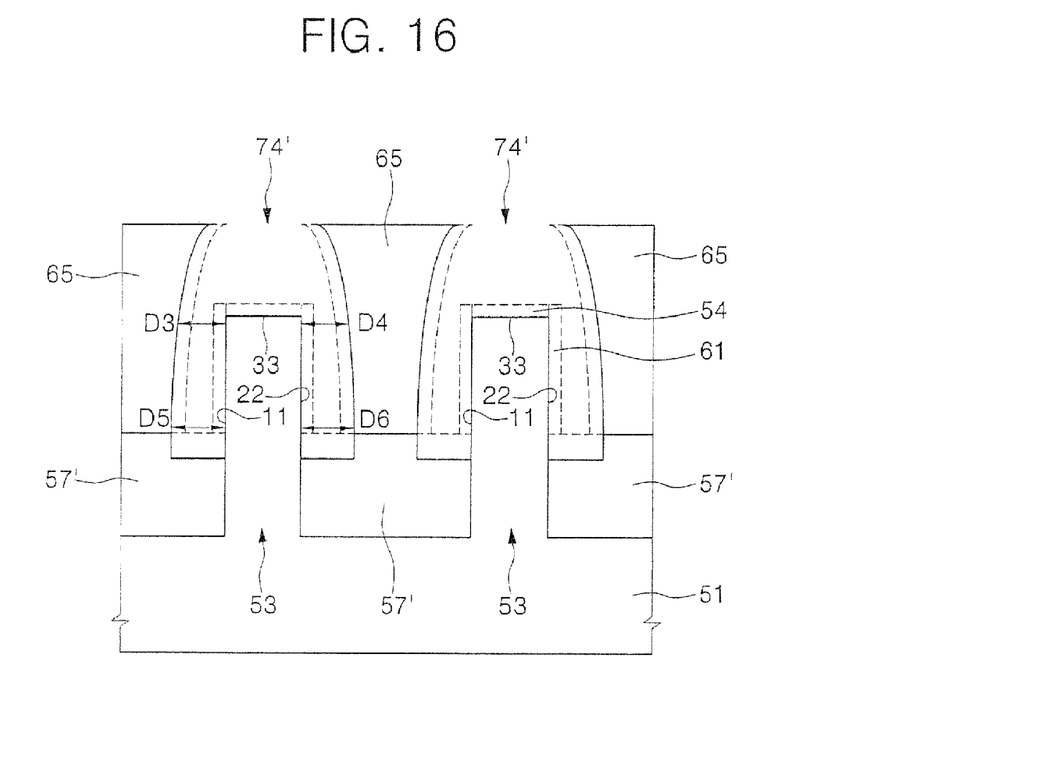

As mentioned above, the preliminary opening 74 may be formed by removing the sacrificial spacer 63' and the hard mask pattern 55 without a photolithography process. Thus, the preliminary opening 74 may be formed self-aligned with the protruding fin body 53. Referring to FIGS. 12 and 16, the preliminary opening 74 may be expanded to form an opening 74'.

The process of expanding the preliminary opening 74 may be performed by an oxide layer etching process until the protruding fin body 53 is exposed. In this case, the top surface 33, the first sidewall 11, and the second sidewall 22 of the protruding fin body 53 may be exposed in the opening 74'. The sacrificial pattern 65 and the isolation layer 57' may also be partially etched. The top surface of the sacrificial pattern 65 may be formed to be higher than the protruding fin body 53. Here, the opening 74' may also be formed self-aligned with the protruding fin body 53.

The oxide layer etching process shows substantially the same etch rate with respect to the same material layer. Specifically, the sacrificial pattern 65 facing the first sidewall 11 and the sacrificial pattern 65 facing the second sidewall 22 may be etched at substantially the same etch rate. At the lower region of the opening 74', the opening 74' may be formed to separate the first sidewall 11 from the sacrificial pattern 65 by a first distance D5, and the second sidewall 22 from the sacrificial pattern 65 by a second distance D6. Thus, the first and second distances D5 and D6 may be substantially equal to each other. Furthermore, when the oxide layer etching process is performed throughout the semiconductor substrate 51 at the same time, the first and second distances D5 and D6 may be substantially equal throughout the semiconductor substrate 51.

Here, the shape of the opening 74' may be determined by the sacrificial spacer 63' and the hard mask pattern 55. The sacrificial spacer 63' may be formed in such a manner that its upper portion has a thickness smaller than that of its lower portion. Thus, a third distance D3 between an upper edge of the first sidewall 11 and the sacrificial pattern 65 facing the upper edge may be shorter than the first distance D5. Similarly, a fourth distance D4 between an upper edge of the second sidewall 22 and the sacrificial pattern 65 facing the upper edge may also be shorter than the second distance D6. Because of the uniform etching rate the third and fourth distances D3 and D4 may be substantially equal to each other. Consequently, it is possible to control the openings 74' formed on the semiconductor substrate 51 to have substantially the same size.

Figure 17:
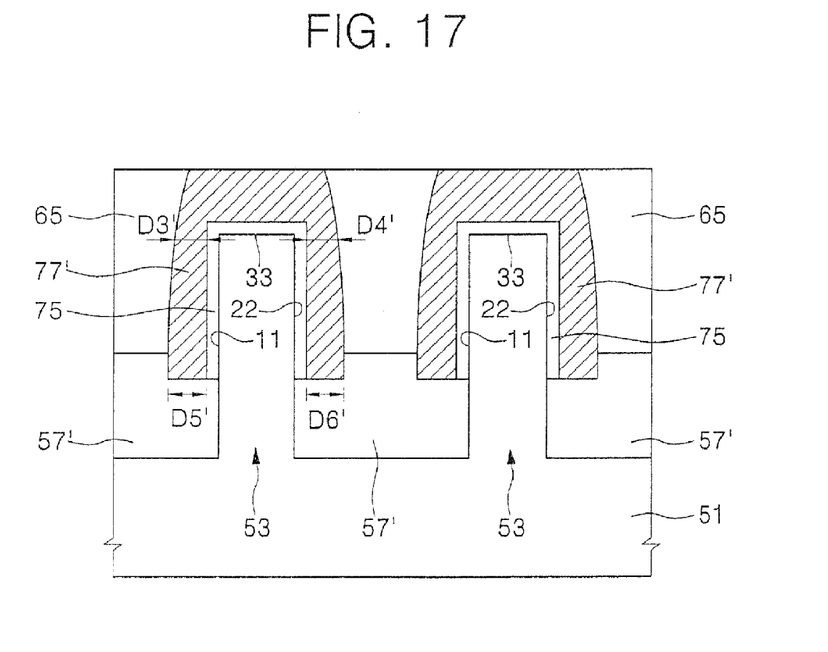

Referring to FIGS. 12 and 17, a tunnel dielectric layer 75 may be formed on the exposed fin body 53. The tunnel dielectric layer 75 may comprise a silicon oxide layer or a high-$k$ dielectric layer.

Subsequently, a floating gate layer may be formed to fill the opening 74' and cover the semiconductor substrate 51. The floating gate layer may be planarized to form a floating gate pattern 77' in the opening 74'. The floating gate layer may comprise a polysilicon layer. The process of planarizing the floating gate layer may be performed by a CMP process using the sacrificial pattern 65 as a stop layer. Alternatively, the process of planarizing the floating gate layer may be performed by an etch-back process. The floating gate pattern 77' may have a flat top surface.

The lower end of the floating gate pattern 77' may be formed to a first thickness D5' on the first sidewall 11, and to a second thickness D6' on the second sidewall 22. The first and second thicknesses D5' and D6' may be determined by the first and second distances D5 and D6, respectively. In other words, the first and second thicknesses D5' and D6' may be substantially equal to each other. Further, the first and second thicknesses D5' and D6' may be substantially equal throughout the semiconductor substrate 51.

In addition, the floating gate pattern 77' may be formed to a third thickness D3' at an upper edge of the first sidewall 11, and a fourth thickness D4' at an upper edge of the second sidewall 22. The third thickness D3' may be smaller than the first thickness D5' and the fourth thickness D4' may be smaller than the second thickness D6'. The third and fourth thicknesses D3' and D4' may also be substantially equal to each other.

Figure 18:
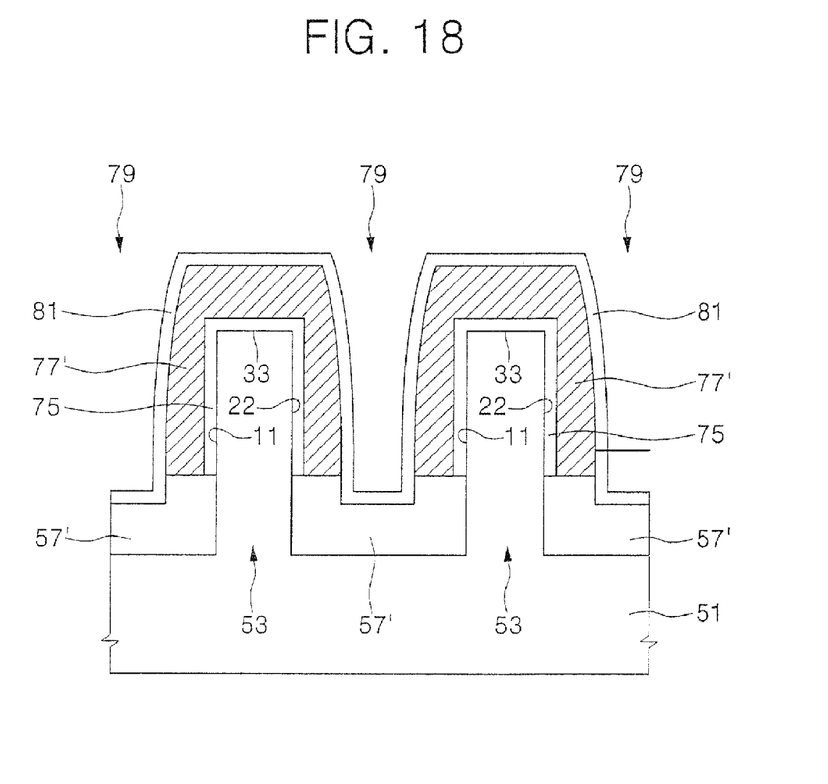

Referring to FIGS. 12 and 18, the sacrificial pattern 65 is removed to expose the sidewalls and top surface of the floating gate pattern 77'. The process of removing the sacrificial pattern 65 may be performed by an oxide layer etching process having an etch selectivity with respect to the floating gate pattern 77'. In this case, grooves 79 may be formed between the floating gate patterns 77'. The isolation layer 57' may be exposed at the bottom of each groove 79. The isolation layer 57' may also be etched such that the bottom of each groove 79 is located lower than the floating gate pattern 77'.

Subsequently, an inter-gate dielectric layer 81 covering the floating gate pattern 77' is formed.

The inter-gate dielectric layer 81 may be formed to surround the floating gate pattern 77' at a substantially uniform thickness and to cover the semiconductor substrate 51. The inter-gate dielectric layer 81 may comprise a silicon oxide layer, a silicon nitride layer, a silicon oxynitride layer, a high-k dielectric layer, or a combination layer thereof. For example, the inter-gate dielectric layer 81 may comprise an ONO (Oxide-Nitride-Oxide) layer.

Figure 19:
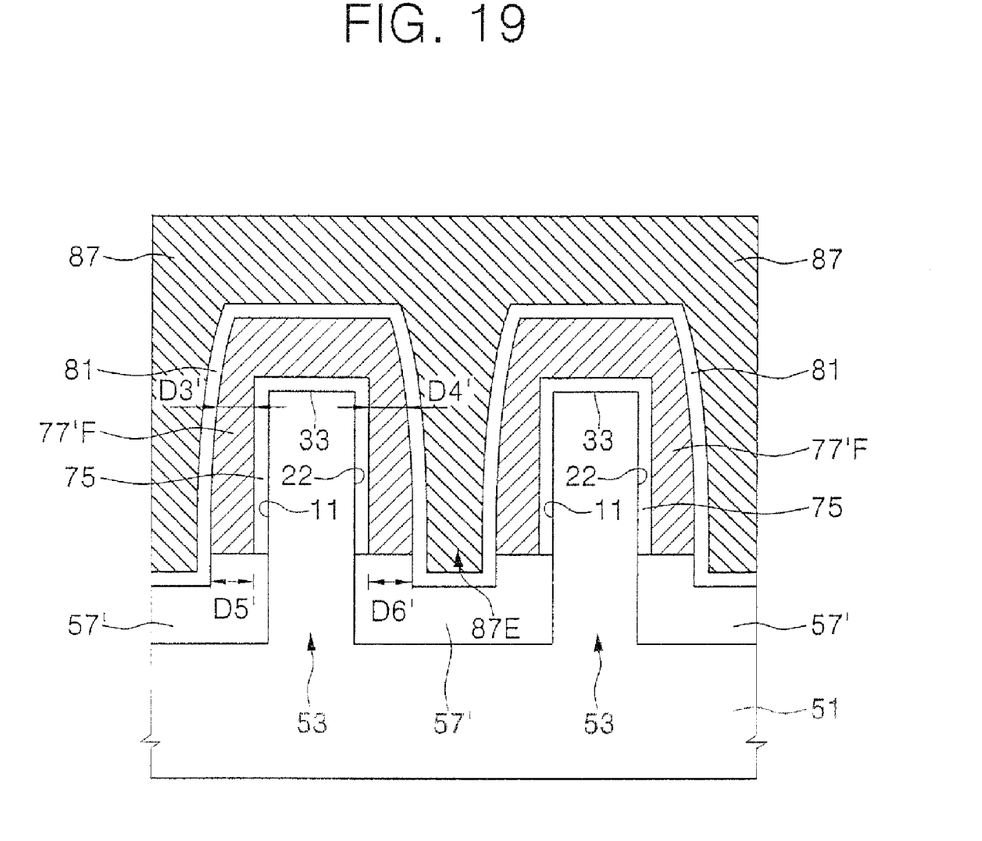

Referring to FIGS. 12 and 19, a control gate conductive layer may be formed on substantially the entire surface of the semiconductor substrate 51 having the inter-gate dielectric layer 81. The control gate conductive layer may comprise a polysilicon layer. The control gate conductive layer, the inter-gate dielectric layer 81, and the floating gate pattern 77' are continuously patterned to form a control gate electrode 87 crossing the fin body 53. Further, a floating gate 77F is formed between the control gate electrode 87 and the fin body 53.

While the control gate conductive layer is formed, a control gate extension 87E may be formed in the groove 79. The control gate extension 87E may be formed to contact the control gate electrode 87. Here, the size of the control gate extension 87E may be determined by the depth of the groove

79. When the bottom of the groove 79 is formed lower than the floating gate patterns 77', a lower end of the control gate extension 87E may also be formed lower than the floating gates 77'F. In other words, the lower end of the control gate extension 87E may be formed to penetrate into the isolation layer 57'. In this case, the control gate extension 87E may prevent parasite capacitance from being generated between the floating gates 77'F.

Hereinafter, a flash memory device according to a first embodiment of the present invention will be described with reference to FIGS. 1 and 11.

Referring to FIGS. 1 and 11 again, an isolation layer 57' defining a fin body 53 is provided in a predetermined region of a semiconductor substrate 51.

The semiconductor substrate 51 may be a silicon wafer. The fin body 53 has a first sidewall 11, a second sidewall 22 facing the first sidewall 11, and a top surface 33. A portion of the fin body 53 protrudes above the isolation layer 57'. A plurality of fin bodies 53 may be disposed parallel to each other within the semiconductor substrate 51. The isolation layer 57' may be an insulating layer such as a silicon oxide layer.

A control gate electrode 87 crossing over the fin body 53 is provided. A floating gate 77F, which is self-aligned with the protruding portion of the fin body 53, is disposed between the control gate electrode 87 and the fin body 53. A tunnel dielectric layer 75 may be interposed between the fin body 53 and the floating gate 77F. An inter-gate dielectric layer 81 may be interposed between the floating gate 77F and the control gate electrode 87.

The floating gate 77F may cover portions of the first and second sidewalls 11 and 22, and the top surface 33 of the protruding fin body 53. The floating gate 77F may have a flat top surface. The floating gate 77F has a first thickness D1' on the first sidewall 11, and a second thickness D2' on the second sidewall 22. The first thickness D1' may be substantially equal to the second thickness D2'. Further, the first and second thicknesses D1' and D2' may be substantially equal throughout the semiconductor substrate 51. The floating gate 77F may be a polysilicon layer.

The control gate electrode 87 may be disposed across all the fin bodies 53. In this case, the floating gates 77F may be disposed between the control gate electrode 87 and each of the fin bodies 53. A control gate extension 87E contacting the control gate electrode 87 may be provided between the floating gates 77F. A lower end of the control gate extension 87E may be located lower than the floating gates 77F. In other words, the lower end of the control gate extension 87E may be disposed to penetrate into the isolation layer 57'. The control gate extension 87E may prevent parasite capacitance from being generated between the floating gates 77F. Both the control gate electrode 87 and the control gate extension 87E may be polysilicon layers.

The tunnel dielectric layer 75 may be a silicon oxide layer or a high-k dielectric layer. The inter-gate dielectric layer 81 may comprise a silicon oxide layer, a silicon nitride layer, a silicon oxynitride layer, a high-k dielectric layer, or a combination layer thereof. For example, the inter-gate dielectric layer 81 may be an ONO (Oxide-Nitride-Oxide) layer.

Hereinafter, a flash memory device according to a second embodiment of the present invention will be described with reference to FIGS. 12 and 19.

Referring to FIGS. 12 and 19 again, an isolation layer 57' defining a fin body 53 is provided in a predetermined region of a semiconductor substrate 51. The fin body 53 has a first sidewall 11, a second sidewall 22 facing the first sidewall 11, and a top surface 33. A portion of the fin body 53 protrudes above the isolation layer 57'. A plurality of fin bodies 53 may be disposed parallel to each other within the semiconductor substrate 51.

A control gate electrode 87 crossing over the fin body 53 is provided. A floating gate 77'F, which is self-aligned with the protruding portion of the fin body 53, is disposed between the control gate electrode 87 and the fin body 53. A tunnel dielectric layer 75 may be interposed between the fin body 53 and the floating gate 77'F. An inter-gate dielectric layer 81 may be interposed between the floating gate 77'F and the control gate electrode 87.

The floating gate 77'F may cover the first and second sidewalls 11 and 22 and the top surface 33 of the protruding fin body 53. The floating gate 77'F may have a flat top surface. A lower end of the floating gate 77'F may be formed to a first thickness D5' on the first sidewall 11, and a second thickness D6' on the second sidewall 22. The first thickness D5' may be substantially equal to the second thickness D6'. Further, the first and second thicknesses D5' and D6' may be substantially equal throughout the semiconductor substrate 51.

In addition, the floating gate 77'F may be formed to a third thickness D3' at an upper edge of the first sidewall 11, and to a fourth thickness D4' at an upper edge of the second sidewall 22. The third thickness D3' may be smaller than the first thickness D5' and the fourth thickness D4' may be smaller than the second thickness D6'. The third thickness D3' may also be substantially equal to the fourth thickness D4'. The floating gate 77'F may be a polysilicon layer.

The control gate electrode 87 may be disposed across all the fin bodies 53. In this case, the floating gates 77'F may be disposed between the control gate electrode 87 and each of the fin bodies 53. A control gate extension 87E contacting the control gate electrode 87 may be provided between the floating gates 77'F. A lower end of the control gate extension 87E may be located lower than the floating gates 77'F. That is, the lower end of the control gate extension 87E may be disposed to penetrate into the isolation layer 57'. The control gate extension 87E may prevent parasite capacitance from being generated between the floating gates 77'F. Both the control gate electrode 87 and the control gate extension 87E may be polysilicon layers.

The tunnel dielectric layer 75 may be a silicon oxide layer or a high-k dielectric layer. The inter-gate dielectric layer 81 may comprise a silicon oxide layer, a silicon nitride layer, a silicon oxynitride layer, a high-k dielectric layer, or a combination layer thereof. For example, the inter-gate dielectric layer 81 may be an ONO (Oxide-Nitride-Oxide) layer.

As described above, according to the present invention, a sacrificial spacer is formed on sidewalls of a fin body. The sacrificial spacer is selectively removed to expose the fin body, and thus a sacrificial pattern having an opening is formed. The opening is formed to a desired size. A floating gate pattern is formed to fill the opening. Thus, the floating gate pattern is self-aligned with the fin body. The opening can be adjusted in size, and thus the floating gate pattern can be adjusted in thickness. The sacrificial pattern is removed to form a groove between the floating gate patterns. An inter-gate dielectric layer covering the floating gate pattern is formed. A control gate conductive layer is formed on substantially the entire surface of the semiconductor substrate having the inter-gate dielectric layer. The control gate conductive layer, the inter-gate dielectric layer, and the floating gate pattern are continuously patterned to form a control gate electrode crossing the fin body as well as a floating gate interposed between the control gate electrode and the fin body. Consequently, it is possible to realize a flash memory device having the self-aligned floating gate on an upper region of the fin body.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating a semiconductor device, comprising:
    forming an isolation layer to define a fin body in a semiconductor substrate, the fin body including a first sidewall, a second sidewall opposite the first sidewall, a top surface, and a portion protruding above the isolation layer;
    forming a sacrificial pattern on the isolation layer, the sacrificial pattern including an opening self-aligned with the protruding portion of the fin body and exposing the protruding portion of the fin body;
    forming an insulated floating gate pattern to at least partially fill the opening;
    removing the sacrificial pattern;
    forming an inter-gate dielectric layer over the floating gate pattern;
    forming a control gate conductive layer over the inter-gate dielectric layer; and
    patterning the control gate conductive layer, the inter-gate dielectric layer, and the floating gate pattern to form a control gate electrode crossing the fin body and a floating gate electrode interposed between the control gate electrode and the fin body.

2. The method as claimed in claim 1, wherein the opening in the sacrificial pattern is formed to separate the sacrificial pattern from the first sidewall by a first distance and to separate the sacrificial pattern from the second sidewall by a second distance, the first and second distances being substantially equal to each other.

3. The method as claimed in claim 1, wherein forming the isolation layer comprises:
    forming a hard mask pattern on the semiconductor substrate;
    etching the semiconductor substrate using the hard mask pattern as an etch mask to form the fin body by forming at least one trench;
    forming a preliminary isolation layer to at least partially fill the trench; and
    etching the preliminary isolation layer in the trench to expose the protruding portion of the fin body.

4. The method as claimed in claim 1, wherein forming the sacrificial pattern having the opening comprises:
    forming a sacrificial spacer layer over the fin body;
    forming a sacrificial layer over the sacrificial spacer layer;
    planarizing the sacrificial layer until a top surface of the sacrificial spacer layer is exposed; and
    etching the sacrificial spacer layer.

5. The method as claimed in claim 4, wherein the sacrificial spacer layer comprises a material layer having an etch selectivity with respect to the sacrificial layer.

6. The method as claimed in claim 4, wherein etching the sacrificial spacer layer is performed until the isolation layer is exposed at the bottom of the opening.

7. The method as claimed in claim 4, further comprising partially etching the sacrificial pattern to expand the opening after etching the sacrificial spacer.

8. The method as claimed in claim 7, wherein removing the sacrificial pattern comprises:
    removing the sacrificial spacer layer remaining on the isolation layer; and
    etching the isolation layer, using the floating gate pattern as an etch mask, such that a portion of the isolation layer not adjoining the floating gate pattern is lower than a lower end of the floating gate pattern.

9. The method as claimed in claim 1, wherein forming the sacrificial pattern having the opening comprises:
    forming a sacrificial spacer on the first and second sidewalls of the fin body;
    forming a sacrificial layer over the sacrificial spacer; and
    etching the sacrificial spacer to define the sacrificial pattern.

10. The method as claimed in claim 9, wherein the sacrificial spacer comprises a material layer having an etch selectivity with respect to the sacrificial layer.

11. The method as claimed in claim 9, further comprising partially etching the sacrificial pattern to expand the opening, after etching the sacrificial spacer.

12. The method as claimed in claim 9, wherein removing the sacrificial pattern comprises etching the isolation layer, using the floating gate pattern as an etch mask, such that a portion of the isolation layer not adjoining the floating gate pattern is lower than a lower end of the floating gate pattern.

13. The method as claimed in claim 1, wherein forming the floating gate pattern comprises:
    forming a tunnel dielectric layer over the protruding portion of the fin body;
    forming a floating gate layer that fills the opening and covers substantially the entire surface of the semiconductor substrate; and
    planarizing the floating gate layer until the sacrificial pattern is exposed.

14. The method as claimed in claim 1, wherein the floating gate has a lower end formed to have a first thickness on the first sidewall and a second thickness on the second sidewall, the first and second thicknesses being substantially equal to each other.

15. The method as claimed in claim 14, wherein the floating gate is formed to have a third thickness at an upper edge of the first sidewall and a fourth thickness at an upper edge of the second sidewall, the third thickness being smaller than the first thickness, the fourth thickness being smaller than the second thickness, the third and fourth thicknesses being substantially equal to each other.

16. The method as claimed in claim 1, wherein the control gate electrode is formed to cover the sidewalls of the floating gate and have a control gate extension extending to the isolation layer, the control gate extension having a lower end located lower than the floating gate electrode.

17. A method of fabricating a semiconductor device, comprising:
    forming an isolation layer in a semiconductor substrate to define a fin body, the fin body protruding above the isolation layer and including a first sidewall, a second sidewall, and a top surface;
    forming a sacrificial spacer to cover the first and second sidewall of the fin body and at least a portion of the isolation layer;
    forming a sacrificial layer over the sacrificial spacer and the isolation layer;

etching the sacrificial spacer, a portion of the sacrificial layer, and a portion of the isolation layer to form a sacrificial pattern including an opening self-aligned with the fin body;

forming an insulated floating gate pattern in the self-aligned opening to cover the exposed portions of the first and second sidewalls of the fin body and the top surface of the fin body;

removing the sacrificial pattern and etching another portion of the isolation layer such that an upper surface of the etched isolation layer not adjoining the floating gate pattern is lower than a lower end of the floating gate pattern;

forming an inter-gate dielectric layer to cover the floating gate pattern;

forming a control gate conductive layer to cover the inter-gate dielectric layer; and patterning the control gate conductive layer, the inter-gate dielectric layer, and the floating gate pattern to form a control gate electrode crossing the fin body and a floating gate electrode interposed between the control gate electrode and the fin body.

18. The method as claimed in claim 17, wherein forming the isolation layer comprises:

forming a hard mask pattern on the semiconductor substrate;

etching the semiconductor substrate using the hard mask pattern as an etch mask, and forming a trench to define the fin body;

forming a preliminary isolation layer to at least partially fill the trench; and etching the preliminary isolation layer in the trench to expose a portion of the first and second sidewalls of the fin body.

19. The method as claimed in claim 17, wherein the sacrificial spacer comprises a material layer having an etch selectivity with respect to the sacrificial pattern.

20. The method as claimed in claim 17, further comprising forming a sacrificial oxide layer on the first and second sidewalls of the fin body before forming the sacrificial spacer.

21. The method as claimed in claim 17, wherein the lower end of the floating gate pattern adjacent to the first sidewall has a first thickness and the lower end of the floating gate pattern adjacent to the second sidewall has a second thickness, the first and second thicknesses being substantially equal to each other.

22. The method as claimed in claim 21, wherein the floating gate pattern is formed to have a third thickness at an upper edge of the first sidewall and a fourth thickness at an upper edge of the second sidewall, the third thickness being smaller than the first thickness, the fourth thickness being smaller than the second thickness, the third and fourth thicknesses being substantially equal to each other.

23. The method as claimed in claim 17, wherein the control gate conductive layer extends lower than the lower end of the floating gate pattern.

* * * * *

UNITED STATES PATENT AND TRADEMARK OFFICE
CERTIFICATE OF CORRECTION

| | |
|---|---|
| PATENT NO. | : 7,329,580 B2 |
| APPLICATION NO. | : 11/425205 |
| DATED | : February 12, 2008 |
| INVENTOR(S) | : Byung-Yong Choi et al. |

It is certified that error appears in the above-identified patent and that said Letters Patent is hereby corrected as shown below:

Column 1, line 48, the word "foaming" should read -- forming --;
Column 6, line 31, the word "57=." should read -- 57'. --.

Signed and Sealed this

Ninth Day of December, 2008

JON W. DUDAS
*Director of the United States Patent and Trademark Office*